United States Patent
Liu et al.

(10) Patent No.: US 10,777,222 B1
(45) Date of Patent: Sep. 15, 2020

(54) TWO-DIMENSIONAL MAGNETIC RECORDING (TDMR) READ HEAD STRUCTURE WITH DIFFERENT STACKED SENSORS AND DISK DRIVE INCORPORATING THE STRUCTURE

(71) Applicant: Western Digital Technologies, Inc., San Jose, CA (US)

(72) Inventors: Xiaoyong Liu, San Jose, CA (US);
Chih-Ching Hu, Pleasanton, CA (US);
Daniele Mauri, San Jose, CA (US);
Ming Mao, Dublin, CA (US);
Guanxiong Li, Fremont, CA (US);
Yukimasa Okada, Cupertino, CA (US);
Ying Hong, Los Gatos, CA (US)

(73) Assignee: WESTERN DIGITAL TECHNOLOGIES, INC. CA (US)

( * ) Notice: Subject to any disclaimer, the term of this patent is extended or adjusted under 35 U.S.C. 154(b) by 0 days.

(21) Appl. No.: 16/792,010

(22) Filed: Feb. 14, 2020

(51) Int. Cl.
*G11B 5/39* (2006.01)
*G11B 5/48* (2006.01)
*G01R 33/09* (2006.01)

(52) U.S. Cl.
CPC .......... *G11B 5/3912* (2013.01); *G01R 33/093* (2013.01); *G01R 33/098* (2013.01); *G11B 5/3906* (2013.01); *G11B 5/3909* (2013.01); *G11B 5/3932* (2013.01); *G11B 5/3948* (2013.01); *G11B 5/3954* (2013.01); *G11B 5/4886* (2013.01); *G11B 5/3964* (2013.01); *G11B 2005/3996* (2013.01)

(58) Field of Classification Search
CPC ... G11B 5/3906; G11B 5/3932; G11B 5/3948; G11B 5/3954; G11B 5/3964
See application file for complete search history.

(56) References Cited

U.S. PATENT DOCUMENTS

| | | | |
|---|---|---|---|
| 8,749,926 B1 | 6/2014 | Le et al. | |
| 9,042,058 B1* | 5/2015 | Li | G11B 5/3951 360/316 |
| 9,042,059 B1 | 5/2015 | Katine et al. | |
| 9,076,468 B1 | 7/2015 | Keener et al. | |
| 9,230,578 B2 | 1/2016 | Batra et al. | |
| 9,269,383 B1* | 2/2016 | Hattori | G11B 5/3912 |
| 9,406,321 B2* | 8/2016 | Kief | G11B 5/397 |
| 9,741,369 B2 | 8/2017 | Batra et al. | |
| 9,786,305 B1* | 10/2017 | Li | G11B 5/3948 |
| 10,586,562 B1* | 3/2020 | Sapozhnikov | G11B 5/3906 |
| 2003/0151855 A1* | 8/2003 | Molstad | G11B 5/09 360/316 |
| 2011/0216432 A1* | 9/2011 | Yanagisawa | G11B 20/10 360/39 |

(Continued)

*Primary Examiner* — Jefferson A Evans (74) *Attorney, Agent, or Firm* — Patterson & Sheridan, LLP; Steven Versteeg (57) ABSTRACT

A hybrid read head structure for two-dimensional magnetic recording (TDMR) in a disk drive has two stacked current-perpendicular-to-the plane magnetoresistive (CPP-MR) read heads or sensors substantially aligned with one another in the along-the track direction to enable both sensors to read data from the same data track. The structure is a hybrid structure formed on the disk drive slider with the lower sensor being a dual free layer (DFL) or scissoring type of CPP-MR sensor and the upper sensor being a single free layer (SFL) type of CPP-MR sensor.

14 Claims, 8 Drawing Sheets

(56) References Cited

U.S. PATENT DOCUMENTS

| | | | | |
|---|---|---|---|---|
| 2012/0307404 A1* | 12/2012 | Braganca | ............ | G01R 33/1284 |
| | | | | 360/245.8 |
| 2013/0286511 A1* | 10/2013 | Edelman | ................ | G11B 5/397 |
| | | | | 360/234.3 |
| 2015/0170678 A1* | 6/2015 | Mastain | ................. | G11B 5/115 |
| | | | | 360/128 |
| 2015/0255092 A1* | 9/2015 | Macken et al. | ...... | G11B 5/3948 |
| | | | | 360/324 |
| 2016/0005424 A1* | 1/2016 | McKinlay | .............. | G11B 5/397 |
| | | | | 360/121 |
| 2016/0202330 A1* | 7/2016 | Yamamoto | ............ | G01R 33/098 |
| | | | | 324/252 |

\* cited by examiner

TWO-DIMENSIONAL MAGNETIC RECORDING (TDMR) READ HEAD STRUCTURE WITH DIFFERENT STACKED SENSORS AND DISK DRIVE INCORPORATING THE STRUCTURE

BACKGROUND

The invention relates generally to two stacked magnetoresistive (MR) sensors to provide a readback signal from the same data track in two-dimensional magnetic recording (TDMR) and a disk drive incorporating the sensors.

One type of conventional magnetoresistive (MR) sensor used as the read head in magnetic recording disk drives is a current-perpendicular-to-the-plane (CPP) sensor wherein the sense current is directed perpendicularly through the planes of the layers in the sensor stack. A CPP-MR sensor has a stack of layers that includes two ferromagnetic layers separated by a non-magnetic spacer layer. If the spacer layer is electrically conductive, for example copper (Cu) or silver (Ag), the sensor is referred to as a giant magnetoresistance (GMR) CPP sensor. If the spacer layer is an electrically insulating material, such as $TiO_2$, MgO or alumina ($Al_2O_3$), the sensor is referred to as a magnetic tunnel junction sensor, also called a tunneling MR or TMR CPP sensor. In a CPP GMR or TMR sensor referred to as a single-free layer (SFL) sensor one ferromagnetic layer adjacent to the spacer layer has its magnetization direction fixed, such as by being pinned by exchange coupling with an adjacent antiferromagnetic layer, and is referred to as the reference or pinned layer. The other ferromagnetic layer adjacent to the spacer layer has its magnetization direction free to rotate in the presence of an external magnetic field and is referred to as the free layer. With a sense current applied to the sensor, the rotation of the free-layer magnetization relative to the pinned-layer magnetization due to the presence of an external magnetic field is detectable as a change in electrical resistance.

Another type of CPP GMR or TMR sensor is a dual-free layer (DFL) or "scissor" sensor that does not have a reference or pinned layer but instead has two free layers separated by a non-magnetic conductive or insulating spacer layer. With a sense current applied to a DFL sensor, the presence of an external magnetic field causes opposite rotation of the magnetizations of the two free layers relative to one another, sometimes referred to as a "scissoring" effect, and is detectable as a change in electrical resistance.

A proposed technology that uses multiple CPP-MR sensors is two-dimensional magnetic recording (TDMR). In one type of TDMR, two stacked sensors are located on a single structure and are aligned to read the same data track, with or without some slight intentional offset in the cross-track direction. The readback signals from the two sensors may be processed to double the signal for the same relative amount of electronic noise, or reduce sensor noise for the same relative amount of signal, and thus increase the signal-to-noise ratio (SNR). Each of the individual CPP-MR sensors in a TDMR read head structure is required to be located between two shields of magnetically permeable material that shield the sensors from recorded data bits that are neighboring the data bit being read. During readback, the shields ensure that each sensor reads only the information from its target bits. TDMR disk drives with two stacked CPP-MR sensors are described in U.S. Pat. No. 9,042,059 B1 and U.S. Pat. No. 9,230,578 B2, both assigned to the same assignee as this application.

SUMMARY

As a result of fabrication and testing of various stacked two-sensor CPP-MR sensor structures it has been discovered that certain sensors suffer from poor SNR of the readback signal. If both sensors are SFL sensors, the lower SFL sensor generally has lower SNR than the upper SFL sensor, and if both sensors are DFL sensors the lower sensor has higher or similar SNR than the upper DFL sensor. Additionally, the lower DFL sensor of the two-DFL structure exhibited substantially the same SNR as the upper SFL sensor of the two-SFL structure.

Embodiments of the invention relate to a hybrid stacked two-sensor CPP-MR structure for TDMR wherein the lower sensor is a DFL sensor and the upper sensor is a SFL sensor.

For a fuller understanding of the nature and advantages of the present invention, reference should be made to the following detailed description taken together with the accompanying figures.

DETAILED DESCRIPTION

Figure 1:
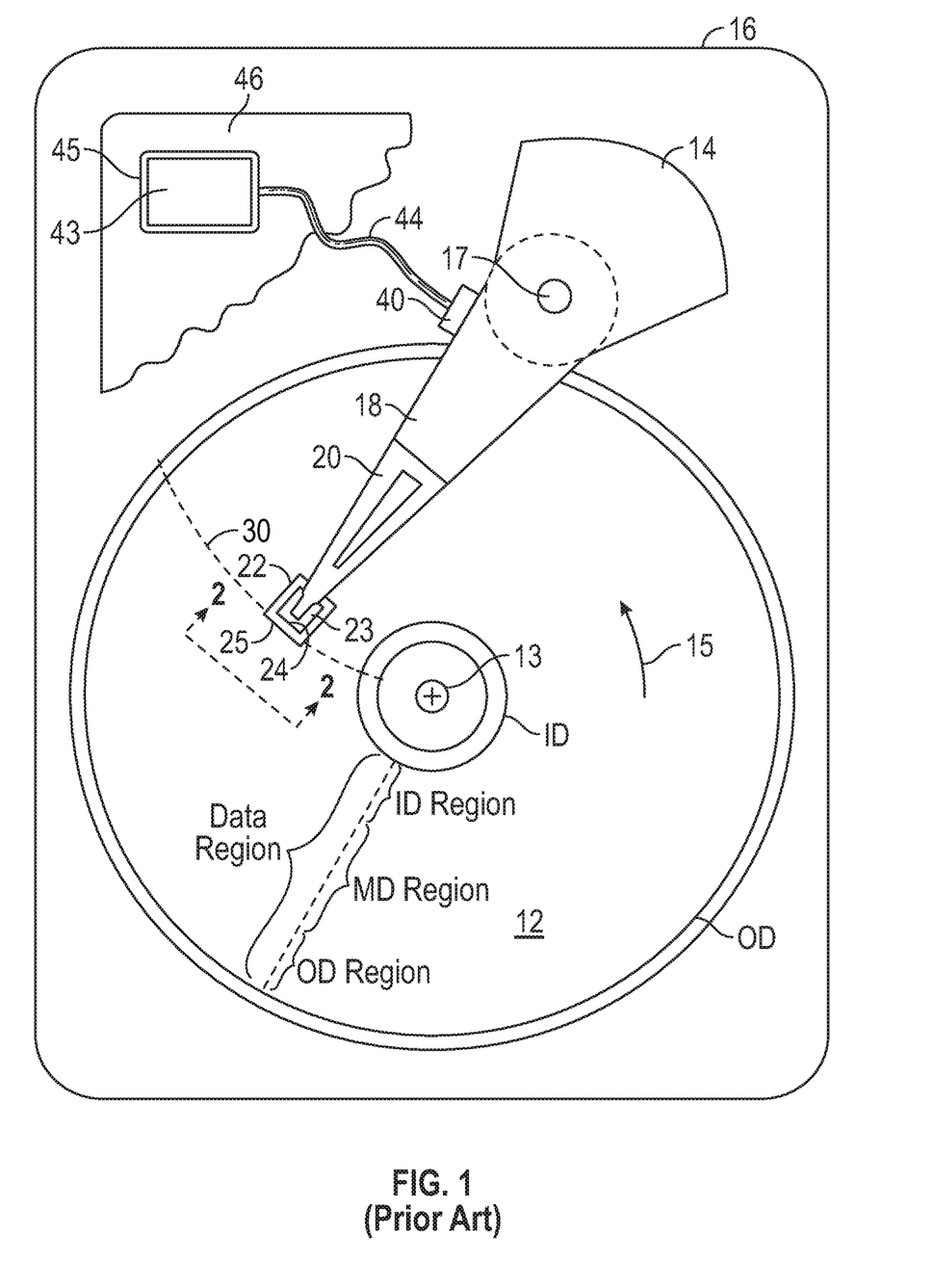
FIG. 1 is a schematic top view of a conventional magnetic recording hard disk drive with the cover removed that can be used for two-dimensional magnetic recording (TDMR).

Embodiments of the CPP-MR sensor structure of this invention have application for use in a TDMR disk drive, the operation of which will be briefly described with reference to FIGS. 1-3. FIG. 1 is a block diagram of a conventional magnetic recording hard disk drive that can function for TDMR. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or gas-bearing slider 22 is attached to the flexure 23. A magnetic recording read/write head 24 is formed on the trailing surface 25 of slider 22. The flexure 23 and suspension 20 enable the slider to "pitch" and "roll" on a gas-bearing, typically air or helium, generated by the rotating disk 12. The rotary actuator 14 moves the head 24 in an arcuate path 30 across the disk 12 between the inside diameter (ID) and outside diameter (OD) of the data region of the disk 12 and maintains the head 24 on a data track during reading and writing of data. Typically, there are multiple disks stacked on a hub that is rotated by the spindle motor, with a separate slider and read/write head associated with each disk surface.

An arm electronics or read/write electronics integrated circuit (R/W IC) chip or module 40 is attached to actuator 14. A flex cable 44 provides electrical connections between the R/W IC 40 and the disk drive system electronics 43 on a circuit board 46 mounted to base plate 16. The flex cable 44 is rigidly attached by stationary bracket 45 at one end, which connects to the system electronics 43. The R/W IC module 40 is in turn connected by a plurality of electrical paths that extend through the suspension 20 and connect to the slider 22.

Figure 2:
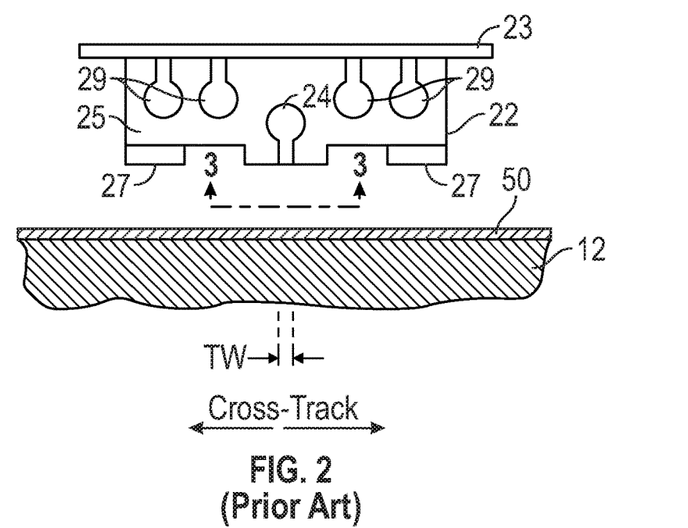
FIG. 2 is a view in the direction 2-2 of FIG. 1 and shows the ends of the write head and TDMR read head structure as viewed from the disk according to the prior art.

FIG. 2 is an enlarged end view of the slider 22 and a section of the disk 12 taken in the direction 2-2 in FIG. 1. The slider 22 is attached to flexure 23 and has a gas-bearing surface (GBS) 27 facing the disk 12 and a trailing surface 25 generally orthogonal to the GBS. The GBS 27 causes the gas flow from the rotating disk 12 to generate a bearing of gas (typically air or helium) that supports the slider 22 in very close proximity to or near contact with the surface of disk 12. The read/write head 24 is formed on the trailing surface 25 and is connected to the disk drive read/write electronics by electrical connection to slider termination pads 29 on the trailing surface 25. As shown in the sectional view of FIG. 2, the disk 12 is a conventional continuous-media (CM) disk wherein the recording layer 50 is a continuous layer of recording material. In a CM disk the concentric data tracks with track width (TW) are created when the write head writes on the continuous recording layer.

Figure 3:
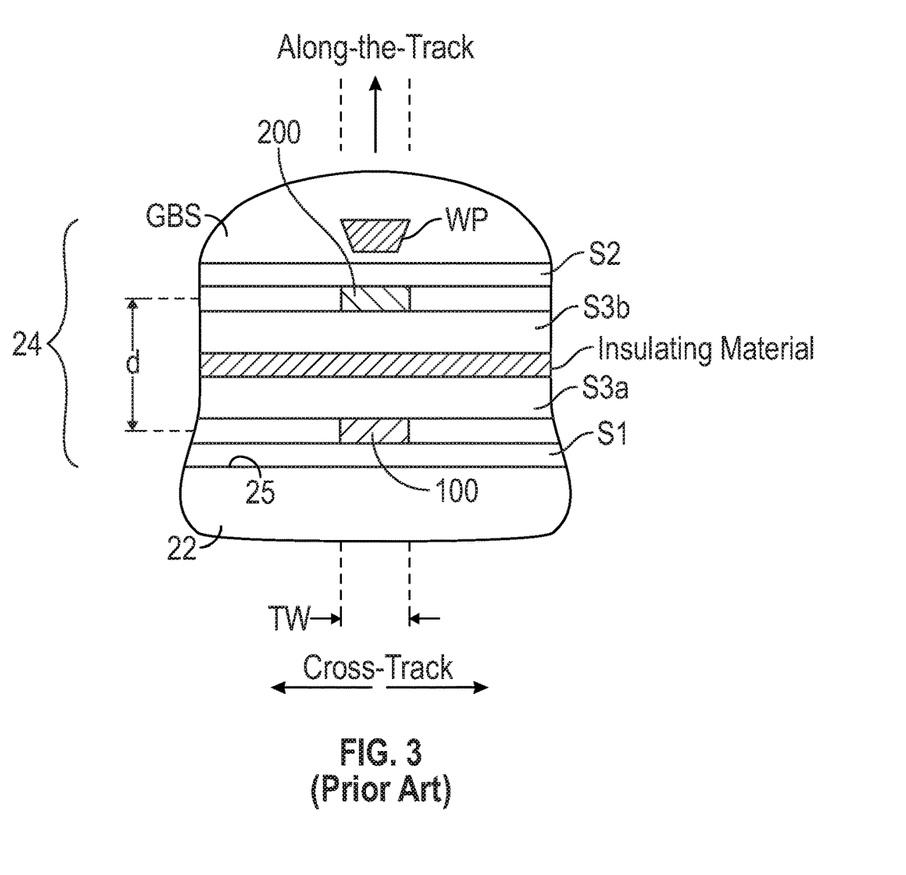
FIG. 3 is view of the gas-bearing surface (GBS) as would be viewed from the disk in the direction 3-3 of FIG. 2 showing the layers making up one type of a stacked CPP-MR sensor structure for TDMR according to the prior art.

FIG. 3 is a view in the direction 3-3 of FIG. 2 and shows the ends of read/write head 24 as viewed from the disk 12. FIG. 3 is not to scale because of the difficulty in showing very small dimensions. The read/write head 24 is a series of thin films deposited and lithographically patterned on the trailing surface 25 of slider 22, using well-known thin film head fabrication techniques. The write head includes a perpendicular magnetic write pole (WP) and may also include trailing and/or side shields (not shown).

The read head portion of read/write head 24 is depicted as a sensor structure of stacked multiple CPP-MR read heads or sensors 100, 200 for use in a disk drive with TDMR. In this example both read sensors 100, 200 are substantially aligned with one another (vertically in FIG. 3) with an along-the-track or "down track" spacing "d" so as to read the same data track with trackwidth TW. The sensors may not be precisely aligned but may have a slight intentional offset with one another in the cross-track direction to compensate for the large skew effect near the ID and OD of the disk. In one application, the readback signals from the two sensors 100, 200 may be processed to double the signal for the same relative amount of electronic noise, and thus increase the signal-to-noise ratio (SNR), or reduce sensor noise for the same relative amount of signal to thus increase the signal-to-noise ratio (SNR). Lower read sensor 100 is located between two magnetic shields, lower shield S1 and center shield S3a. Upper read sensor 200 is also located between two magnetic shields, center shield S3b and upper shield S2. The shields S1, S3a, S3b and S2 are formed of magnetically permeable material and may be electrically conductive so they can function as the electrical leads to the read sensors 100 and 200. The shields may be formed of any of the well-known materials used for conventional magnetic shields, for example NiFe alloys wherein Ni is present in the NiFe alloy in an amount greater than about between 40 atomic percent. Alternatively, other soft ferromagnetic materials may be used, like NiFeCr, NiFeMo, CoZrTa, CoZrNb and CoFeZr alloys. A layer of insulating material, for example alumina, separates shields S3a and S3b so that the two sensors are electrically isolated from one another. The function of the shields is to shield the read sensors 100 and 200 from recorded data bits that neighbor the data bit being read. Typically the lower and upper shields S1 and S2, respectively, may each be up to several microns thick in the along-the-track direction, as compared to the total thickness of each read sensor 100, 200 in the along-the-track direction, which may be in the range of about 20 to 100 nm.

Figure 4:
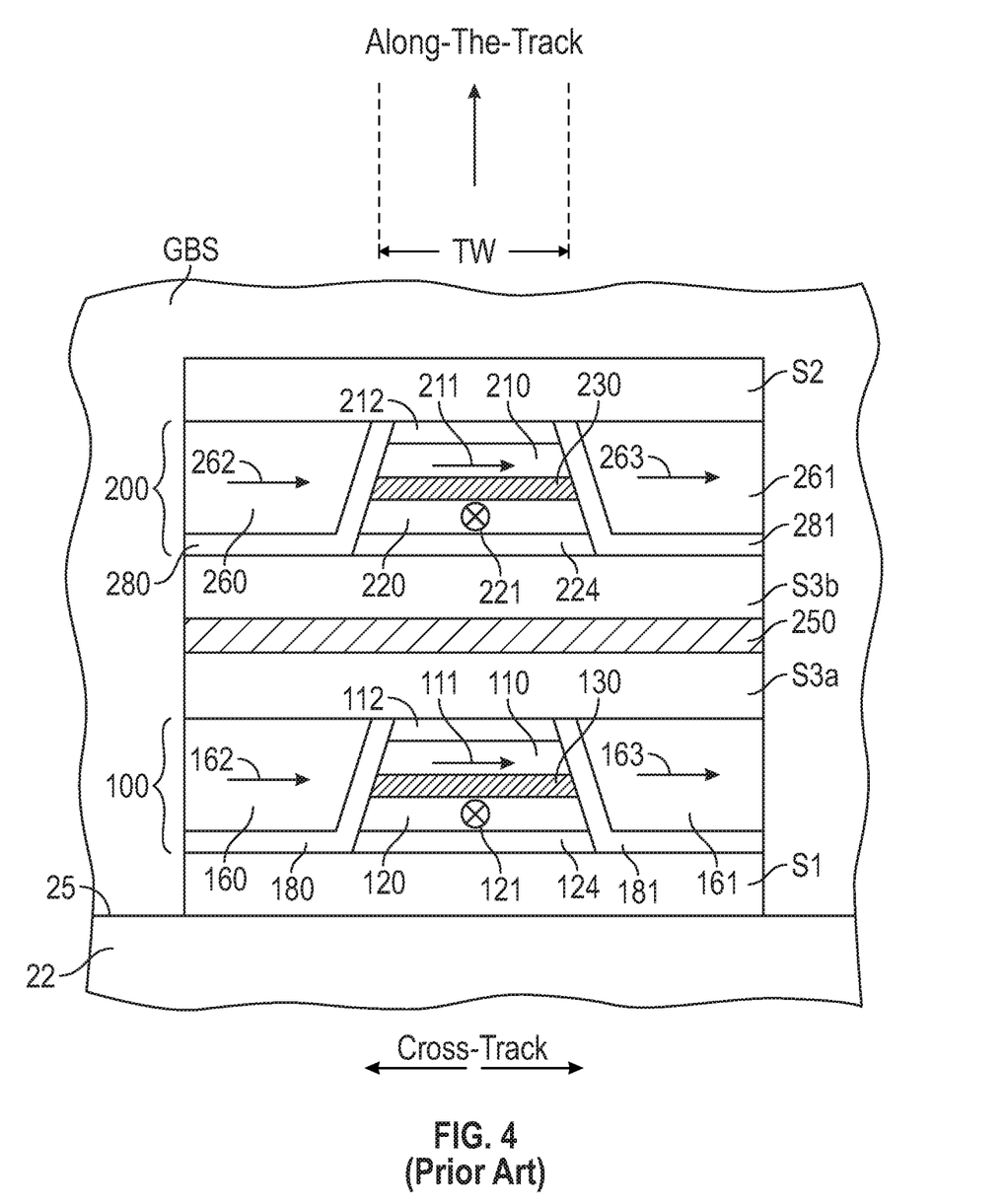
FIG. 4 is view of the GBS as would be viewed from the disk showing the layers making up two stacked single free layer (SFL) sensors for TDMR according to the prior art.

FIG. 4 is a view of the GBS showing the layers making up one type of a stacked CPP-MR sensor structure with two SFL sensors according to the prior art as would be viewed from the disk. The lower sensor 100 is generally aligned with, or slightly offset from, upper sensor 200 so that both sensors can read the same data track. FIG. 4 depicts a simplified example of a stacked CPP-MR sensor structure for TDMR and does not illustrate all details of several variations of such structures, for example the structure shown and described in U.S. Pat. No. 9,042,059 B1, which is assigned to the same assignee as this application.

Lower sensor 100 is located between bottom shield S1, which is located on the slider substrate, i.e., the trailing surface 25 of slider 22 (see FIG. 3), and lower middle shield S3a. The sensor 100 layers include a reference or pinned ferromagnetic layer 120 having a fixed magnetic moment or magnetization 121 oriented orthogonal to the GBS (into the page), a free ferromagnetic layer 110 having a magnetic moment or magnetization 111 parallel to the GB S that can rotate in the plane of layer 110 in response to transverse external magnetic fields from the disk, and a non-magnetic spacer layer 130 between the pinned layer 120 and free layer 110. The CPP-MR sensor 100 may be a CPP GMR sensor, in which case the non-magnetic spacer layer 130 would be formed of an electrically conducting material, typically a metal like Cu or Ag, or a metal alloy. Alternatively, the CPP-MR sensor 100 may be a CPP tunneling MR (CPP-TMR) sensor, in which case the non-magnetic spacer layer 130 would be a tunnel barrier formed of an electrically insulating material, like $TiO_2$, MgO or $Al_2O_3$. The pinned layer 120 may have its magnetization pinned by being exchange-coupled to an antiferromagnetic (AF) layer 124. The AF layer 124 is typically a Mn alloy, e.g., PtMn, NiMn, FeMn, IrMn, PdMn, PtPdMn or RhMn. A non-magnetic capping layer 112, which may be a single layer or multiple layers of different materials, such as Ru, Ta and Ti, located above the free ferromagnetic layer 110 provides corrosion protection, and adjusts the spacing between free layer 110 and lower middle shield S3a.

In the presence of an external magnetic field in the range of interest, i.e., magnetic fields from recorded data on the disk, the magnetization 111 of free layer 110 will rotate while the magnetization 121 of pinned layer 120 will remain fixed and not rotate. Thus when a sense current is applied from top shield perpendicularly through the sensor 100 layers, the magnetic fields from the recorded data on the disk will cause rotation of the free-layer magnetization 111 relative to the pinned-layer magnetization 121, which is detectable as a change in electrical resistance.

The structure, function and method of fabrication of CPP-MR sensor 100 are well-known and thus not described in detail in this application. Upper sensor 200 with corresponding 200 series numbered items is substantially identical in structure and function to sensor 100.

Longitudinal bias layers 160, 161 are formed outside of sensor 100, near the side edges of the sensor 100, particularly near the side edges of free layer 110 to longitudinally bias the magnetization 111 of free layer 110. The bias layers 160, 161 have magnetizations 162, 163, respectively, and thus longitudinally bias the magnetization 111 of free layer 110. Seed layers 170, 171 are located below bias layers 160, 161 and insulating layers 180, 181 are located below the seed layers 170, 171. Bias layers 160, 161 are electrically insulated from side edges of sensor 100 by electrically insulating layers 180, 181, which are typically formed of alumina, a silicon nitride ($SiN_x$) or another metal oxide like a Ta oxide or a Ti oxide or MgO. The bias layers 160, 161 may be formed of a hard magnetic material but more typically will be formed of "soft" magnetic material, meaning material that can be easily magnetized and demagnetized at low magnetic fields, so as to function as soft side shields. The side shields may be formed of any of the well-known materials used for conventional magnetic shields. If the bias layers 160, 161 are soft side shields, then an antiferromagnetic material (not shown) may be used adjacent to the soft side shields to stabilize the magnetizations 162, 163 of the soft side shield bias layers 160, 161.

Upper sensor 200 is located between upper middle shield S3b and upper shield S2 and is separated and magnetically isolated from lower sensor 100 by non-magnetic insulating separation layer 250, which may be formed, for example, of alumina or a Ti oxide. Upper sensor 200 includes bias layers 260, 261 with magnetizations 262, 263 and insulating layers 280, 281. The bias layers 260, 261 may have the same structure, composition and function as previously described for side bias layers 160, 161.

As part of the development of embodiments of this invention it has been discovered that, as a result of the required fabrication process, the lower sensor 100 produces substantially lower signal-to-noise ratio (SNR) in the readback signal. Because of the need to provide electrical leads connected to the middle shields S3a, S3b, these layers must extend much wider and longer than the sensor structure, which prevents both sensors from being patterned at the same time. Instead, the layers making up lower sensor 100 are deposited as full films and then a full film level annealing is performed to set the magnetization 121 of pinned layer 120. Photoresist deposition and patterning and milling are performed on the full films to define the trackwidth (TW) of the sensor 100, followed by refill to form the bias layers 160, 161 and further milling to define the overall width defined by side edges of the bias layers 160, 161. The middle shields S3a, S3b and separation layer 250 are then on deposited on lower sensor 100 to have a width beyond the edges of the bias layers 160, 161 because electrical connection must be made to provide leads to the sensors. After chemical-mechanical polishing or other planarization step, the layers making up upper sensor 200 are then deposited as full films and then a full film level annealing is performed to set the magnetization 221 of pinned layer 220. However, because the pinned layer 120 has already been patterned to the desired dimension and its magnetization 121 set, this second annealing step can adversely affects the properties of the pinned layer 120 as well as damage the lower sensor 100 at its edges. This can result in a reduction in SNR of the lower sensor 100. TDMR sensor structures with two stacked SFL sensors fabricated as described above were measured for SNR. In one example for a structure with a TW of 31 nm, the lower sensor produced a SNR of the readback signal that was 2 dB lower than the SNR for the upper sensor. In a second example for a structure with a TW of 33 nm, the lower sensor produced a SNR of the readback signal that was 1 dB lower than the SNR for the upper sensor.

Figure 5:
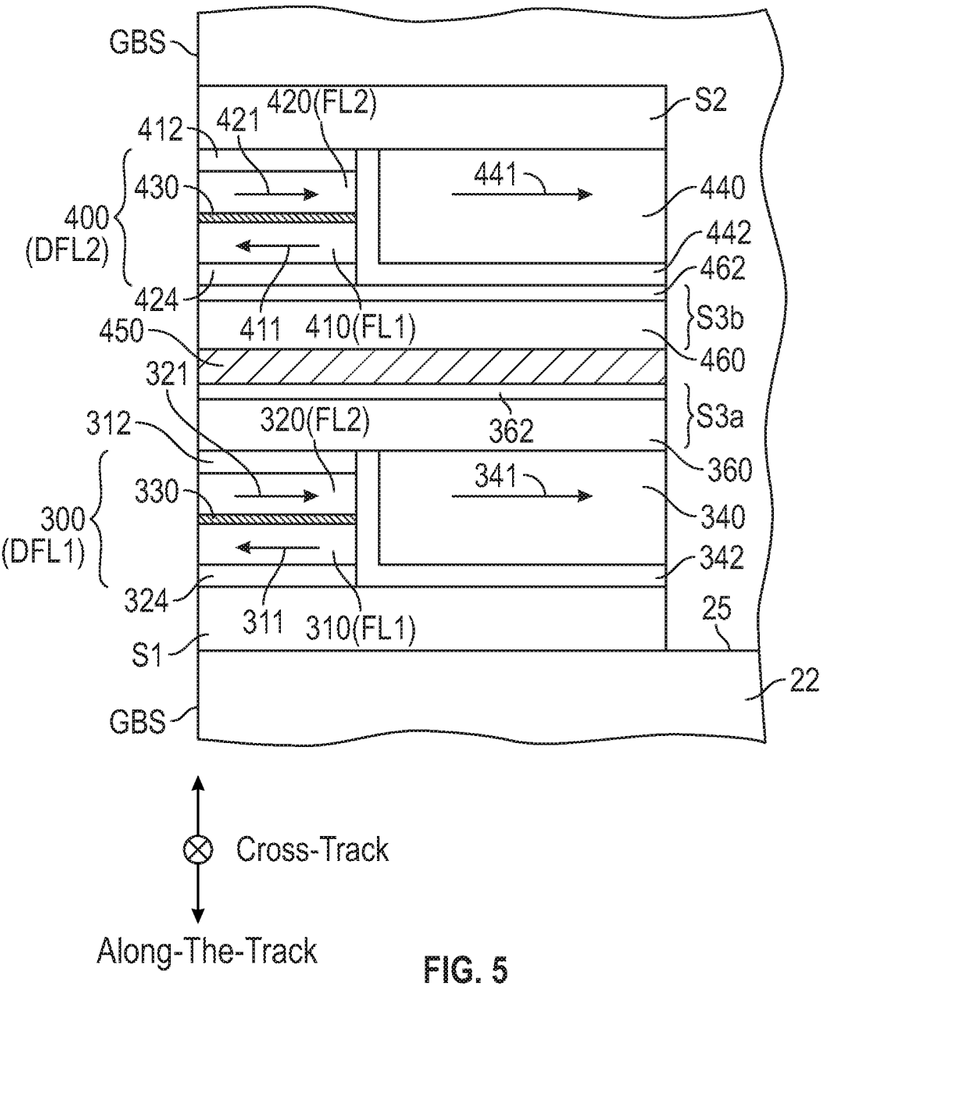
FIG. 5 is a side sectional view with an edge view of the GBS showing the layers making up two stacked dual free layer (DFL) sensors for TDMR.

As part of the development of embodiments of this invention a stacked CPP-MR sensor structure with two DFL sensors was fabricated. FIG. 5 is a side sectional view of the structure depicting the edge of the GBS. The lower sensor 300 (DFL1) is generally aligned along the same TW as upper sensor 400 (DFL2) so that both sensors read the same data track. The two sensors may have an intentional offset with one another in the cross-track direction to compensate for sensor "skew" as the rotary actuator moves the sensors across the disk between the ID and OD of the disk. Upper DFL2 sensor 400 is located between upper middle shield S3b and upper shield S2. Upper DFL2 sensor 400 is separated and magnetically isolated from lower DFL1 sensor 300 by non-magnetic insulating separation layer 450, which may be formed of alumina.

Lower DFL1 sensor 300 is located between bottom shield S1, which is located on the slider substrate, i.e., the trailing surface 25 of slider 22 (see FIG. 3), and lower middle shield S3a, which may be a bilayer of a magnetic shield layer 360 in contact with an antiferromagnetic layer 362. One or both of middle shields S3a, S3b may contain an antiferromagnetic layer, like layers 362, 462, respectively. The DFL1 sensor 300 layers include first and second ferromagnetic free layers 310 (FL1) and 320 (FL2) separated by non-magnetic spacer layer 330. This spacer layer 330 may be a non-magnetic electrically insulating barrier layer like $TiO_2$, MgO or $Al_2O_3$, or an electrically conducting layer like Cu, Au, Ag, Ru, Rh or Cr and their alloys. Free layers 310, 320 are located at the front edge (the GBS) so as to sense recorded data from the disk. The DFL1 sensor 300 includes a rear hard bias layer 340 recessed from the GBS with a magnetization 341. Without the presence of hard bias layer 340 and in the absence of an external magnetic field the magnetizations 311, 321 of free layers 310, 320 would be oriented antiparallel due to magnetostatic coupling. However, the hard bias layer 340 biases the magnetizations 311, 321 away from being antiparallel so that they make a non-zero angle relative to one another. (The magnetizations 311, 321 are depicted as being in the plane of the paper in FIG. 5. However, magnetization 311 is thus at an angle out of the paper and magnetization 321 is at an angle into the paper). The antiparallel alignment of magnetizations 311, 321 is not stable and can flip. For this reason synthetic antiferromagnet (SAF) soft bias structures (not shown but illustrated in FIG. 7A) reinforce the antiparallel state. In the presence of recorded data from the disk the magnetizations 311, 321 rotate relative to another in a scissoring effect, which results in a detectable change in electrical resistance. If the spacer layer 330 is an electrically insulating barrier layer, then the sensor is a CPP-TMR sensor that operates based on the spin dependent tunneling effect of electrons tunneling through the barrier layer 330. If the spacer layer 330 is an electrically conductive spacer layer, then the sensor is a CPP-GMR sensor and the change in resistance results from spin dependent scattering phenomenon. The hard bias layer 340 may be formed of a Co/Pt multilayer and is separated from S1 and the free layers 310, 320 by an insulating layer (not shown) and non-magnetic seed layer 342.

The structure, function and method of fabrication of lower DFL1 sensor 300 are well-known and thus not described in detail in this application. A DFL sensor and its method of fabrication are described in U.S. Pat. No. 9,076,468 B1, which is assigned to the same assignee as this application. Upper DFL2 sensor 400 with corresponding 400 series numbered items is substantially identical in structure and function to lower DFL1 sensor 300.

Figure 6A:
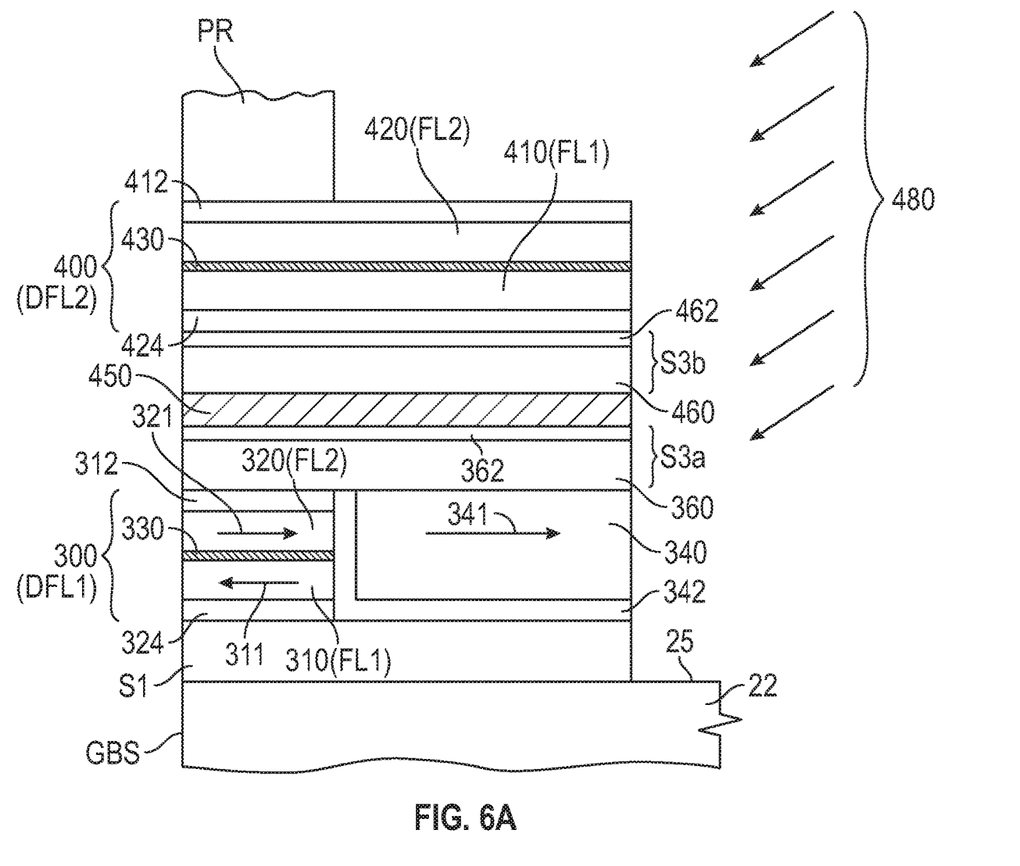
FIG. 6A is a side sectional view with an edge view of the GBS depicting a two-DFL sensor structure after the layers making up upper DFL sensor have been deposited as full films and before angled ion milling of the structure back edge.
Figure 6B:
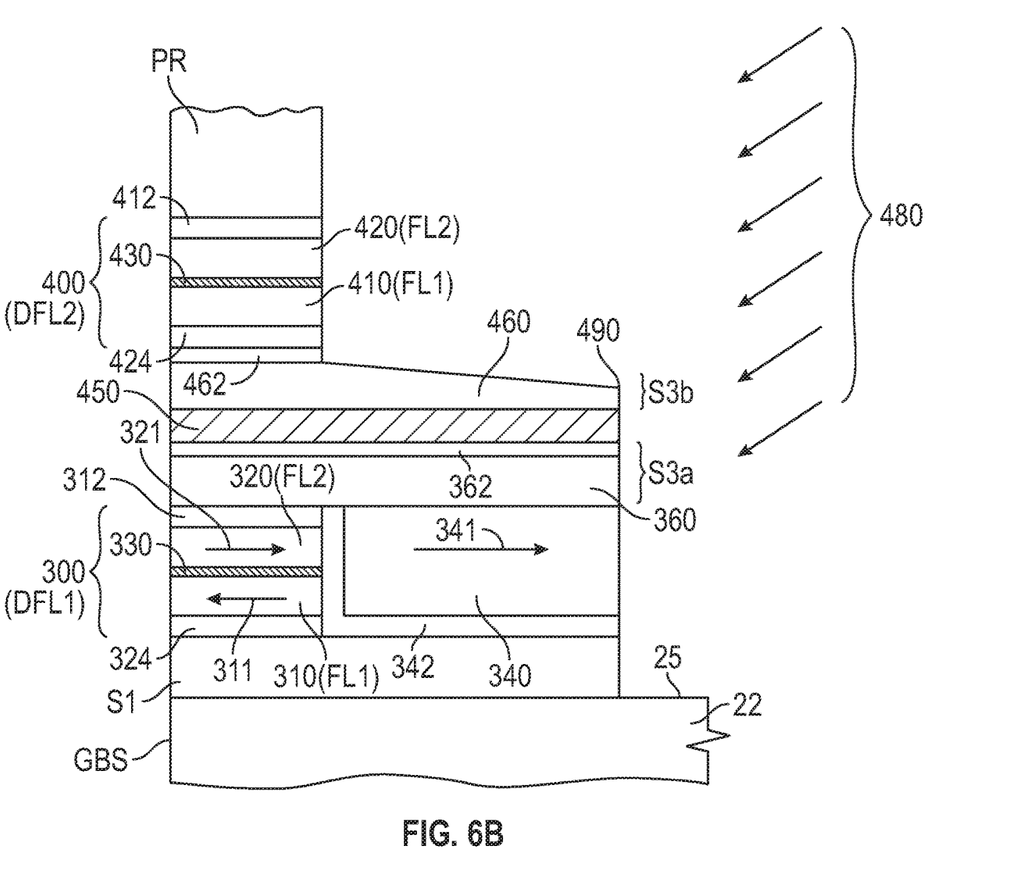
FIG. 6B is a side sectional view with an edge view of the GBS depicting a two-DFL sensor structure after angled ion milling of the structure back edge and illustrating thinning of the center magnetic shield.

Following the fabrication of the structure shown in FIG. 5, it was discovered that the upper DFL2 sensor 400 as well as the combined TDMR has reduced performance. This is a result of the milling process required before refill of the region recessed from the free layers that forms the hard bias layer 440. FIG. 6A is a schematic depicting the structure after the lower DFL1 sensor 300 has been patterned, after the shields S3a, S3b and separation layer have been formed and after the layers making up upper DFL2 sensor (layers 424, 410, 430, 420 and 412) have been deposited as full films. At this point, photoresist (PR) has been deposited and patterned to define the back edge of the free layers 410, 420. Angled ion milling, depicted by arrows 480, is then performed to mill away the exposed portions of the full films, preferably down to layer 460 of shield S3b, so that this region can be backfilled with seed layer 442 and hard bias layer 440. However, as depicted in FIG. 6B, because the milling is required to be at an angle, a portion of S3b near the back edge 490 is also milled, resulting in a thinner S3b. This will result in the electrical resistance of upper DFL2 sensor 400 being high due to the thinner shield. The shield is part of the current path for the sensor and the thin shield will contribute to lead resistance. It is desired to have lower resistance, which reduces noise and thus increases the SNR of the readback signal from the sensor.

TDMR sensor structures with two stacked DFL sensors fabricated as described above were measured for SNR. The lower DFL sensor exhibited slightly higher SNR than the upper DFL sensor, as expected due to the increased resistance caused by the thinned middle shield electrical lead. However, the lower DFL sensor also exhibited 1 −2 dB greater SNR than the lower layer of the two-SFL structure and substantially the same SNR as the upper SFL sensor of the two-SFL structure.

Figure 7A:
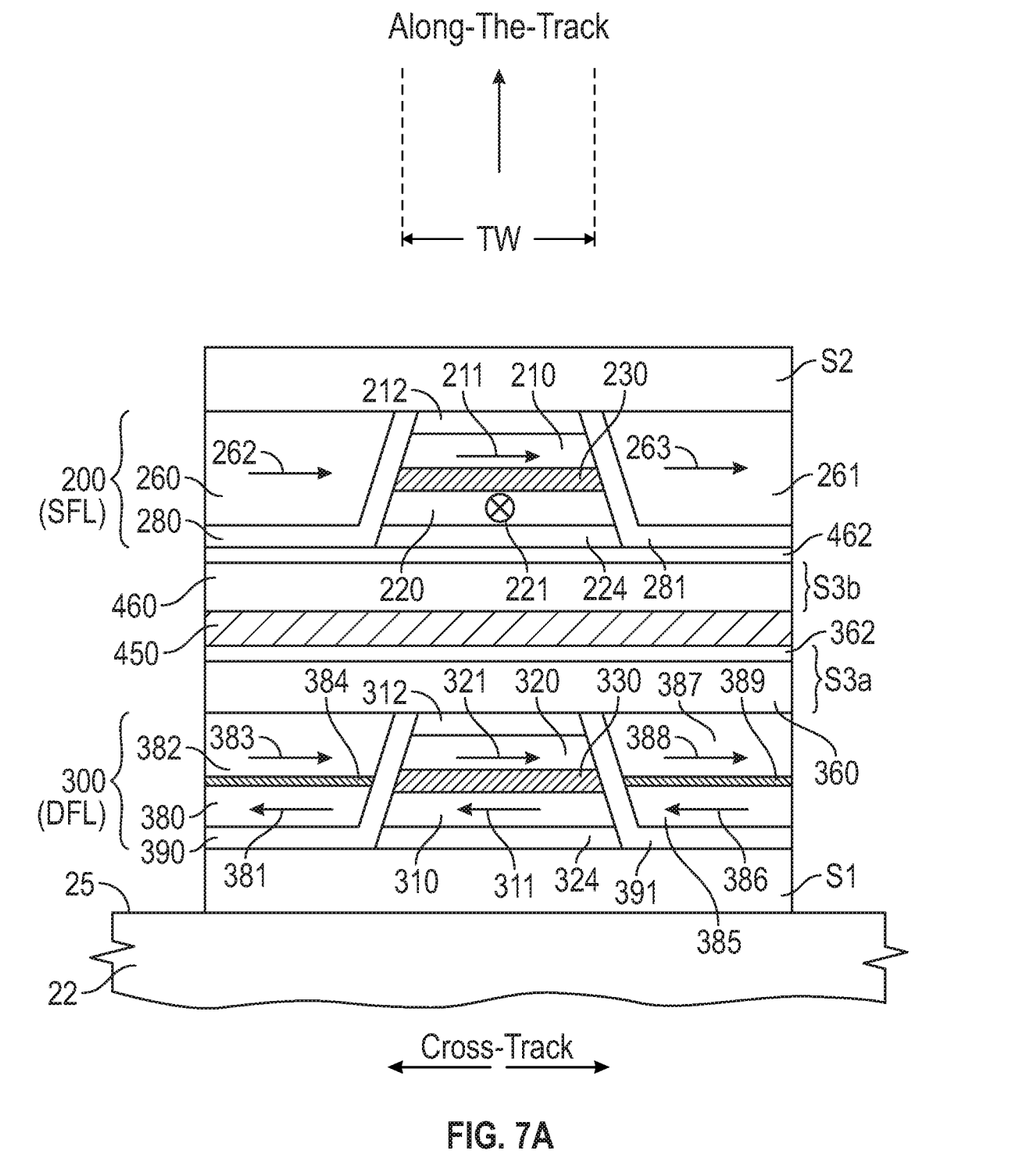
FIG. 7A is a view of the GBS as would be viewed from the disk showing the layers making up the hybrid stacked CPP-MR sensor structure of a lower DFL sensor and upper SFL sensor according to an embodiment of the invention.
Figure 7B:
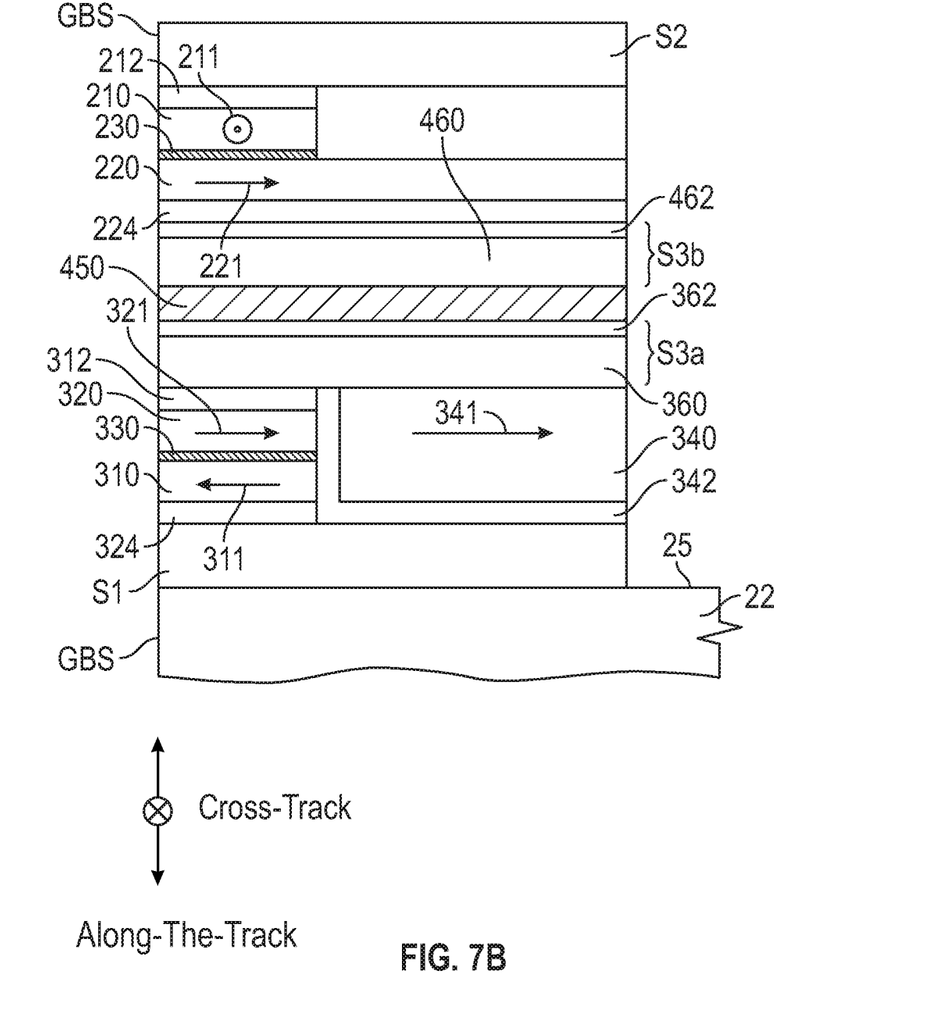
FIG. 7B is a side sectional view with an edge view of the GBS showing the layers making up the hybrid stacked CPP-MR sensor structure of a lower DFL sensor and upper SFL sensor according to an embodiment of the invention.

As a result of the discovery of adverse SNR performance in certain sensors as described above, an embodiment of the invention is a hybrid stacked CPP-MR sensor structure with a lower DFL sensor and an upper SFL sensor. This is shown in FIG. 7A, which is a view of the GBS showing the layers making up the stacked CPP-MR sensor structure as would be viewed from the disk and FIG. 7B, which is a side sectional view of the sensor structure depicting the edge of the GBS. Lower DFL sensor is like previously described DFL sensor 300 (FIG. 5). Upper SFL sensor is like previously described SFL sensor 200 (FIG. 4). FIG. 7A illustrates antiparallel coupled soft side shields for longitudinal biasing of the free layer magnetizations 311, 321 of lower DFL sensor 300. Magnetically soft layers 380, 382 with antiparallel magnetizations 381, 383, respectively, are separated by APC layer 384 and insulated from S1 by insulating layer 390. Magnetically soft layers 385, 387 with antiparallel magnetizations 386, 388, respectively, are separated by APC layer 389 and insulated from S1 by insulating layer 391. The magnetizations 381, 386 bias the magnetization 311 of FL1 layer 310 and the magnetizations 383, 388 bias the magnetization 321 of FL2 layer 320, and thus keep the magnetizations from flipping. This type of soft side shield for DFL sensors is well known and sometimes referred to as a synthetic antiferromagnetic (SAF) soft side shield. U.S. Pat. No. 8,749,926 B1 and U.S. Pat. No. 9,076,468 B1, both of which are assigned to the same assignee as this application, describe SAF soft side shields for DFL sensors.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor structure for sensing magnetically recorded data from data tracks on a magnetic recording medium, the structure comprising:
   a bottom magnetic shield;
   a dual free layer (DFL) magnetoresistive sensor on the bottom magnetic shield and having a front edge for facing a magnetic recording medium, the DFL sensor comprising first and second ferromagnetic free layers, a non-magnetic spacer layer between the first and second free layers, and a rear ferromagnetic biasing layer recessed from the DFL sensor front edge for biasing the first and second free layers' magnetizations to make a non-zero angle relative to one another;
   a first middle magnetic shield on the DFL sensor;
   a non-magnetic separation layer on the first middle shield;
   a second middle magnetic shield on the separation layer;
   a single free layer (SFL) magnetoresistive sensor on the second middle magnetic shield and having a front edge for facing a magnetic recording medium, the SFL sensor comprising a ferromagnetic free layer having a magnetization oriented generally parallel to said SFL sensor front edge, a pinned ferromagnetic layer having a magnetization oriented generally orthogonal to said SFL sensor front edge and a non-magnetic spacer layer between the free and pinned layers; and
   a top magnetic shield on the SFL sensor; and
   wherein the SFL sensor is substantially aligned with the DFL sensor for sensing data from the same data track.

2. The sensor structure of claim 1 wherein the DFL sensor is a current-perpendicular-to-the-plane (CPP) giant magnetoresistance (GMR) sensor and the non-magnetic spacer layer is formed of an electrically conductive metal or metal alloy.

3. The sensor structure of claim 1 wherein the DFL sensor is a current-perpendicular-to-the-plane (CPP) tunneling magnetoresistance (TMR) sensor and the spacer layer is a non-magnetic barrier layer formed of an electrically insulating material.

4. The sensor structure of claim 1 wherein the SFL sensor is a current-perpendicular-to-the-plane (CPP) giant magnetoresistance (GMR) sensor and the non-magnetic spacer layer is formed of an electrically conductive metal or metal alloy.

5. The sensor structure of claim 1 wherein the SFL sensor is a current-perpendicular-to-the-plane (CPP) tunneling magnetoresistance (TMR) sensor and the non-magnetic spacer layer is formed of an electrically insulating material.

6. The sensor structure of claim 1 wherein the DFL sensor further comprises a soft side shield of antiparallel coupled layers of magnetically permeable material adjacent each side of the DFL free layers at the sensor front edge for biasing the magnetizations of the DFL free layers.

7. The sensor structure of claim 1 wherein at least one of the first and second middle magnetic shields comprises a layer of magnetically permeable and a layer of antiferromagnetic material.

8. A two-dimensional magnetic recording (TDMR) disk drive comprising:
    a rotatable magnetic recording disk having a plurality of circular data tracks;
    a slider having a gas-bearing surface (GBS) facing the disk and a trailing surface substantially orthogonal to the GBS and extending in a generally cross-track direction relative to the data tracks;
    the sensor structure of claim 1 supported on the trailing surface of the slider; and
    a rotary actuator connected to the slider for moving the slider across the disk and maintaining the DFL sensor and SFL sensor on a data track.

9. A magnetic recording disk drive slider for supporting a read head and a write head to read and write data in tracks of a magnetic recording disk, the slider having a gas-bearing surface (GBS) for facing the disk and a trailing surface substantially orthogonal to the GBS and extending in a generally cross-track direction relative to the tracks of the disk, the slider comprising:
    a first magnetic shield layer on the trailing surface of the slider;
    a dual free layer (DFL) magnetoresistive read head on the first shield layer and having a front edge aligned in the cross-track direction at the GBS, the DFL read head comprising first and second ferromagnetic free layers, a non-magnetic spacer layer between the first and second free layers, soft magnetic bias structures adjacent the first and second free layers in the cross-track direction, each soft magnetic bias structure comprising two side ferromagnetic biasing layers separated by a non-magnetic antiparallel coupling layer for biasing the magnetizations of the first and second free layers substantially in the cross-track direction, and a rear ferromagnetic biasing layer recessed from the GBS for biasing the magnetizations of the first and second free layers to make a non-zero angle relative to one another;
    a first middle magnetic shield on the DFL read head;
    a non-magnetic separation layer on the first middle shield;
    a second middle magnetic shield on the separation layer;
    a single free layer (SFL) magnetoresistive read head on the second middle magnetic shield and having a front edge aligned in the cross-track direction at the GBS, the SFL read head being substantially aligned with the DFL read head in an along-the-track direction orthogonal to the cross-track direction so as to read data from the same track as the DFL read head, the SFL read head comprising a ferromagnetic free layer having a magnetization oriented generally parallel to said SFL sensor front edge, a pinned ferromagnetic layer having a magnetization oriented generally orthogonal to the GBS, a non-magnetic spacer layer between the free and pinned layers, and ferromagnetic biasing layers adjacent the single free layer in the cross-track direction for biasing the magnetization of the single free layer substantially in the cross-track direction; and
    a second magnetic shield on the SFL read head.

10. The slider of claim 9 wherein the non-magnetic spacer layer of the DFL read head and the non-magnetic spacer layer of the SFL read head are each formed of an electrically conductive metal or metal alloy.

11. The slider of claim 9 wherein the non-magnetic spacer layer of the DFL read head and the non-magnetic spacer layer of the SFL read head are each a non-magnetic barrier layer formed of an electrically insulating material.

12. The slider of claim 9 wherein the SFL read head is slightly offset from the DFL read head in the cross-track direction.

13. The slider of claim 9 wherein at least one of the first and second middle magnetic shields comprises a layer of magnetically permeable material and a layer of antiferromagnetic material.

14. A two-dimensional magnetic recording (TDMR) disk drive comprising:
    a rotatable magnetic recording disk having a plurality of circular data tracks;
    the slider according to claim 9; and
    a rotary actuator connected to the slider for moving the slider across the disk and maintaining the DFL read head and SFL read head on a data track.

* * * * *